United States Patent
Chang et al.

(10) Patent No.: US 7,845,394 B2
(45) Date of Patent: Dec. 7, 2010

(54) HEAT PIPE WITH COMPOSITE WICK STRUCTURE

(75) Inventors: Chang-Shen Chang, Taipei Hsien (TW); Juei-Khai Liu, Taipei Hsien (TW); Chao-Hao Wang, Taipei Hsien (TW); Hsien-Sheng Pei, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 268 days.

(21) Appl. No.: 11/959,291

(22) Filed: Dec. 18, 2007

(65) Prior Publication Data
US 2009/0084526 A1    Apr. 2, 2009

(30) Foreign Application Priority Data
Sep. 28, 2007  (CN) .................. 2007 1 0123707

(51) Int. Cl.
*F28D 15/00* (2006.01)
*H05K 7/20* (2006.01)
(52) U.S. Cl. .............................. 165/104.26; 165/104.21
(58) Field of Classification Search ............ 165/104.21, 165/104.26; 361/700; 257/715; 174/15.2
See application file for complete search history.

(56) References Cited

U.S. PATENT DOCUMENTS

| | | | | |
|---|---|---|---|---|
| 3,700,028 A | * | 10/1972 | Noren ......................... 165/272 |
| 3,844,342 A | * | 10/1974 | Eninger et al. ......... 165/104.26 |
| 3,901,311 A | * | 8/1975 | Kosson et al. .......... 165/104.26 |
| 3,913,664 A | * | 10/1975 | Roukis et al. .......... 165/104.26 |
| 4,003,427 A | * | 1/1977 | Leinoff et al. .......... 165/104.26 |
| 4,019,571 A | * | 4/1977 | Kosson et al. .......... 165/104.26 |
| 4,058,159 A | * | 11/1977 | Iriarte ................... 165/104.26 |
| 4,565,243 A | * | 1/1986 | Ernst et al. ............. 165/104.26 |
| 4,917,177 A | * | 4/1990 | Gernert ................. 165/104.26 |
| 2005/0092467 A1 | * | 5/2005 | Lin et al. ............... 165/104.26 |
| 2006/0086482 A1 | * | 4/2006 | Thayer et al. .......... 165/104.26 |
| 2006/0207750 A1 | | 9/2006 | Chang et al. | |
| 2007/0089864 A1 | | 4/2007 | Chang et al. | |

* cited by examiner

*Primary Examiner*—Tho v Duong
(74) *Attorney, Agent, or Firm*—Jeffrey T. Knapp

(57) ABSTRACT

A heat pipe includes an elongated casing (10), a wick (13), at least one artery mesh (12), and working medium filling in the casing. The casing has an evaporating section (101) and a condensing section (102). The wick is disposed on an inner wall of the evaporating section. The at least one artery mesh includes a large portion (121) and a small portion (122) with an outer diameter smaller than that of the large portion. The small portion is located within and contacts with the wick, and the large portion contacts with the inner wall of the condensing section of the casing. The working medium saturates the wick and the at least one artery mesh.

12 Claims, 8 Drawing Sheets

HEAT PIPE WITH COMPOSITE WICK STRUCTURE

BACKGROUND OF THE INVENTION

1. Field of the Invention

The present invention relates generally to a heat transfer apparatus, and more particularly to a heat pipe having composite capillary wick structure.

2. Description of Related Art

Heat pipes have excellent heat transfer performance due to their low thermal resistance, and are therefore an effective means for transfer or dissipation of heat from heat sources. Currently, heat pipes are widely used for removing heat from heat-generating components such as central processing units (CPUs) of computers.

A heat pipe is usually a vacuum casing containing therein a working medium, which is employed to carry, under phase transitions between liquid state and vapor state, thermal energy from an evaporator section to a condenser section of the heat pipe. Preferably, a wick structure is provided inside the heat pipe, lining an inner wall of the casing, for drawing the working medium back to the evaporator section after it is condensed at the condenser section. In operation, the evaporator section of the heat pipe is maintained in thermal contact with a heat-generating component. The working medium contained at the evaporator section absorbs heat generated by the heat-generating component and then turns into vapor and moves towards the condenser section where the vapor is condensed into condensate after releasing the heat into ambient environment. Due to the difference in capillary pressure which develops in the wick structure between the two sections, the condensate is then brought back by the wick structure to the evaporator section where it is again available for evaporation.

In order to draw the condensate back timely, the wick structure provided in the heat pipe is expected to provide a high capillary force and meanwhile generate a low flow resistance for the condensate. In ordinary use, the heat pipe needs to be flattened to enable the miniaturization of electronic products incorporating the heat pipe, which may result in damage to the wick structure of the heat pipe. When this happens, the flow resistance of the wick structure is increased and the capillary force provided by the wick structure is decreased, which in turn reduces the heat transfer capability of the heat pipe. If the condensate is not quickly brought back from the condenser section, the heat pipe will suffer a dry-out problem at the evaporator section.

Therefore, it is desirable to provide a heat pipe with improved heat transfer capability; wick structure of the heat pipe will not be damaged and still can have a satisfied wicking force when the heat pipe is flattened.

SUMMARY OF THE INVENTION

The present invention relates to a heat pipe for removing heat from heat-generating components. In accordance with a preferred embodiment of the present invention, the heat pipe includes an elongated casing, a wick, at least one artery mesh, and working medium filling in the casing. The casing has an evaporating section and a condensing section. The wick is disposed on an inner wall of the evaporating section. The at least one artery mesh includes a large portion and a small portion with an outer diameter smaller than that of the large portion. The small portion is located within and contacts with the wick, and the large portion contacts with the inner wall of the condensing section of the casing. The working medium saturates the wick and the at least one artery mesh.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present heat pipe can be better understood with reference to the following drawings. The components in the drawings are not necessarily drawn to scale, the emphasis instead being placed upon clearly illustrating the principles of the present heat pipe. Moreover, in the drawings, like reference numerals designate corresponding parts throughout the several views.

DETAILED DESCRIPTION OF THE INVENTION

Figure 1:
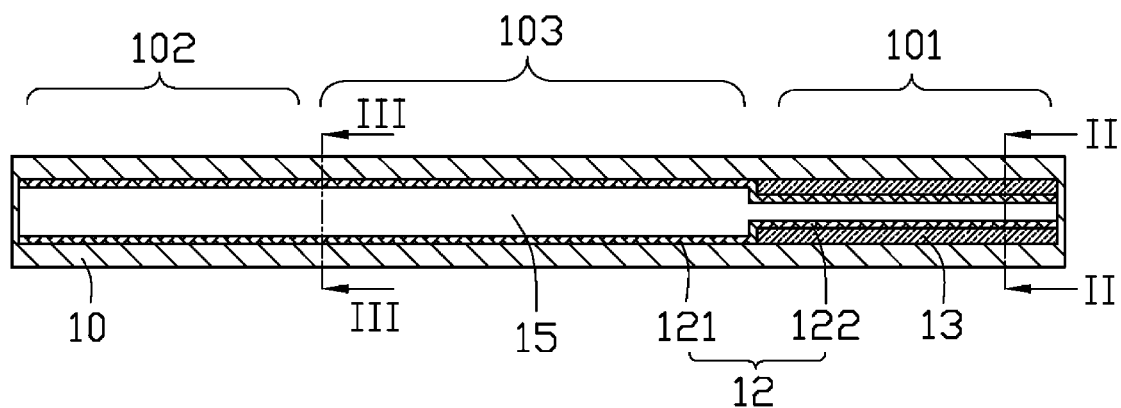
FIG. 1 is a longitudinal cross-sectional view of a heat pipe in accordance with a first embodiment of the present invention.
Figure 2:
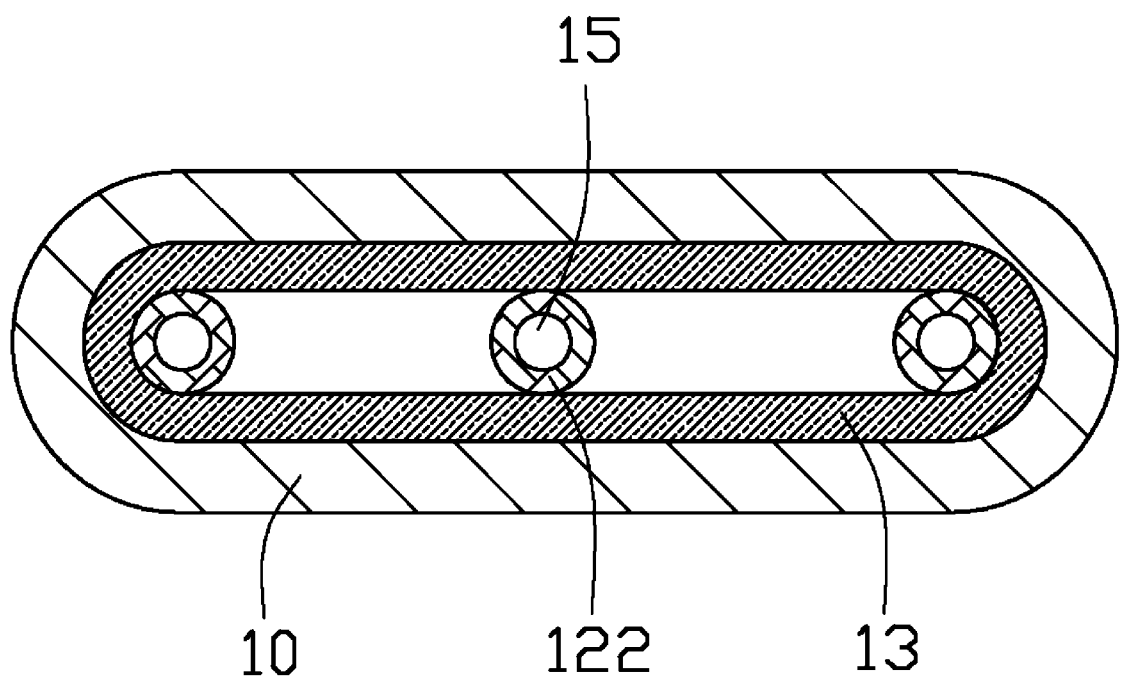
FIG. 2 is a transverse cross-sectional view of an evaporating section of the heat pipe of FIG. 1 taken along line II-II.
Figure 3:
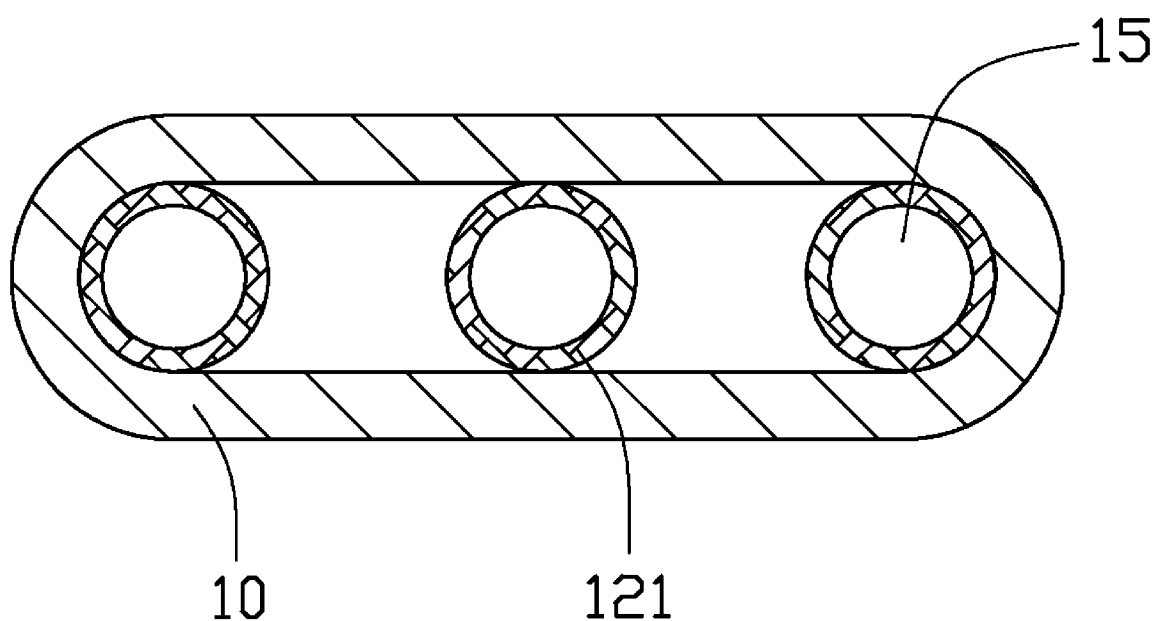
FIG. 3 is a transverse cross-sectional view of a condensing section of the heat pipe of FIG. 1 taken along line III-III.

FIGS. 1-3 illustrate a heat pipe in accordance with a first embodiment of the present invention. The heat pipe is a plate-type heat pipe, and includes a flat tube-like metal casing 10 with two ends thereof being sealed, and a variety of elements enclosed in the metal casing 10, i.e., a wick 13, three artery meshes 12, and a working medium (not shown).

The casing 10 is made of high thermally conductive material such as copper or aluminum. A width of the casing 10 is larger than a height of the casing 10. To accommodate lightweight requirement of electronic products, the height of the casing 10 is preferably not larger than 2 mm. The casing 10 has an evaporating section 101, an opposing condensing section 102 along a longitudinal direction of the heat pipe, and an adiabatic section 103 disposed between the evaporating section 101 and the condensing section 102. The working medium is saturated in the wick 13 and the artery meshes 12. The working medium is usually selected from a liquid such as water, methanol, or alcohol, which has a low boiling point. The casing 10 of the heat pipe is evacuated and hermetically sealed after the working medium is injected into the casing 10 and saturated in the wick 13 and the artery mesh 12. Thus, the working medium can easily evaporate to vapor when it receives heat at the evaporating section 101 of the heat pipe.

The wick 13 is provided around an inner wall of the evaporating section 101 of the casing 10 and arranged at the evaporating section 101. The wick 13 is elliptic-shaped in profile, and usually selected from a porous structure such as grooves, sintered powder, screen mesh, bundles of fiber, or carbon nanotubes, which enable the wick 13 to provide a capillary force to drive condensed working medium at the condensing section 102 of the heat pipe to flow towards the evaporating section 101 thereof. In this embodiment, the wick 13 is screen mesh for the thickness and pore size of the screen mesh can be easily changed. The thickness of the wick 13 is preferably smaller than 0.1 mm.

Figure 4:
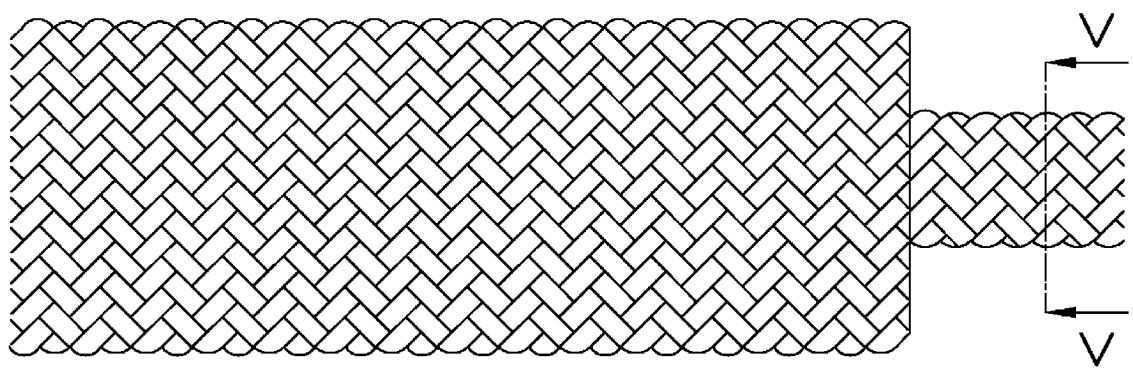
FIG. 4 is an enlarged, front view of an artery mesh of the heat pipe of FIG. 1.
Figure 5:
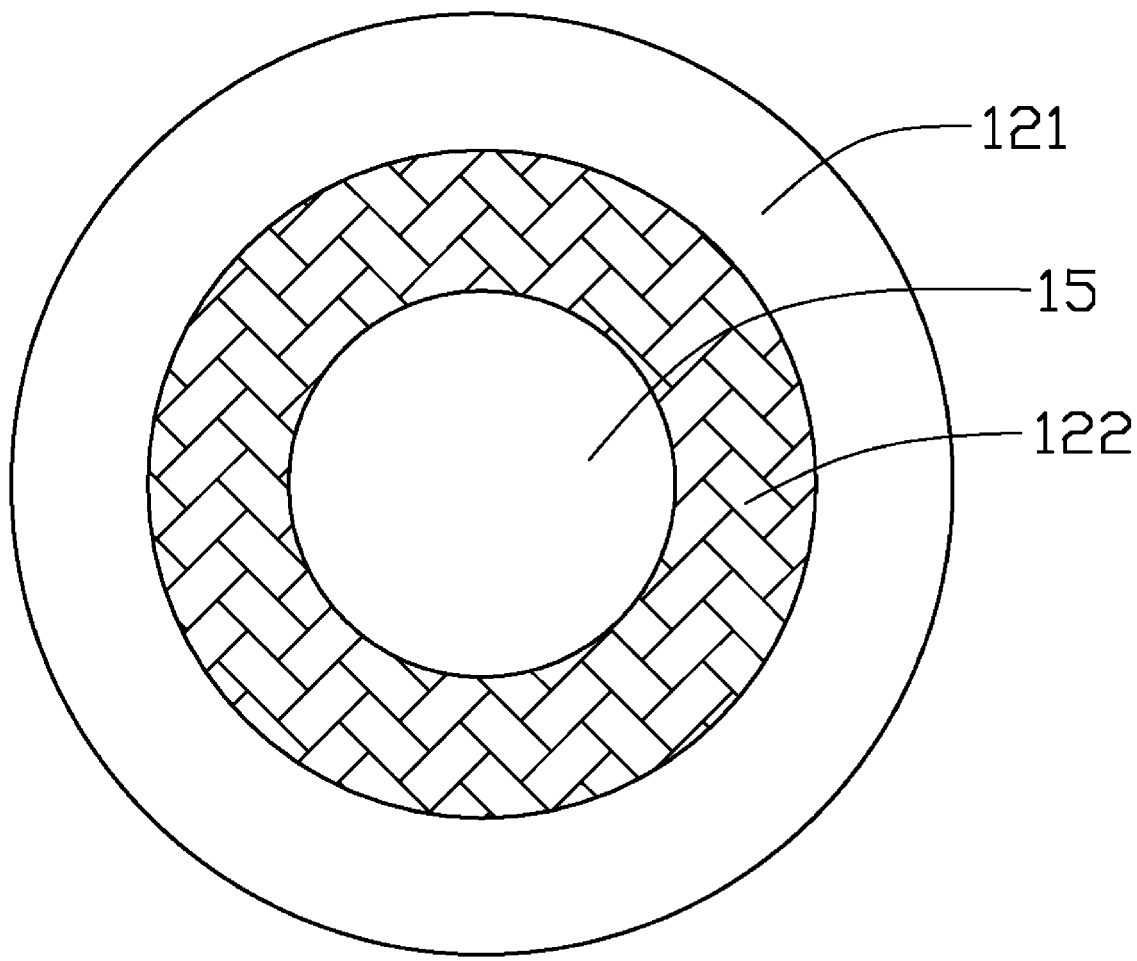
FIG. 5 is a transverse cross-sectional view of the artery mesh of FIG. 4 taken along line V-V.

Referring to FIGS. 4-5, the artery meshes 12 are formed by weaving a plurality of metal wires, such as copper or stainless steel wires, and thus have a plurality of pores formed thereon. Each artery mesh 12 is an elongated and step-shaped hollow tube, and extends along the longitudinal direction of the metal casing 10 from the evaporating section 101 to the condensing section 102. A channel 15 is defined in each artery mesh 12 with a diameter ranging from about 0.5 mm to about 2 mm. Each artery mesh 12 includes a large portion 121 and a small portion 122. A length of the small portion 122 is approximately the same as that of the wick 13, and a length of the large portion 121 is approximately the same as a length of a sum of the adiabatic section 103 and the condensing section 102. A thickness of the large portion 121 is the same as that of the small portion 122. An inner diameter of the large portion 121 is larger than that of the small portion 122, and thus each artery mesh 12 forms a step-shaped inner surface. An outer diameter of the large portion 121 is larger than that of the small portion 122, and thus each artery mesh 12 forms a step-shaped outer surface. The outer diameter of the large portion 121 is approximately the same as an inner diameter of the casing 10, and the outer diameter of the small portion 122 is approximately the same as an inner diameter of the wick 13.

When assembled, the three artery meshes 12 are disposed into the casing 10 in parallel, and are evenly spaced from each other. The large portions 121 are linearly attached to the top and bottom sides of the inner wall of the adiabatic section 103 and the condensing section 102 of the casing 10, and the small portions 122 are linearly attached to the top and bottom sides of the inner surface of the wick 13 at the evaporating section 101. A composite wick structure is thus formed in the casing 10 of the heat pipe. The diameter of the channel 15 of the artery mesh 12 is very small so that the condensate in the can condensing section 102 enter into the channel 15, and the vapor in the evaporating section 101 can not enter into the channels 15; thus the inner space of the casing 10 between the artery meshes 12 provides a passage just for the vapor flowing from the evaporating section 101 to the condensing section 102, and the channels 15 of the artery meshes 12 provide a passage just for the condensate flowing back from the condensing section 102 to the evaporating section 101. On the other hand, as the wick 13 and the artery meshes 12 each have a plurality of pores communicating with each other, the two components 13, 12 can provide a capillary action to the working medium.

In operation, the evaporating section 101 of the heat pipe is placed in thermal contact with a heat source (not shown), for example, a central processing unit (CPU) of a computer, that needs to be cooled. The working medium contained in the evaporating section 101 of the heat pipe is vaporized into vapor upon receiving the heat generated by the heat source. Then, the generated vapor moves via the inner space between the artery meshes 12. After the vapor releases the heat carried thereby and is condensed into condensate in the condensing section 102, the condensate flows through the pores and the channels 15 of the artery meshes 12 to the evaporating section 101 of the heat pipe for being available again for evaporation. Meanwhile, the condensate is capable of entering into the wick 13 easily due to the pores thereof which communicate with the pores of the artery meshes 12 and can provide capillary action. As a result, the condensate is drawn back to the evaporating section 101 rapidly and timely, thus preventing a potential dry-out problem occurring at the evaporating section 101 of the heat pipe. In addition, the artery meshes 12 are step-shaped, and the small portions 122 of the artery meshes 12 and the wick 13 form the composite wick structure at the evaporating section 101 of the heat pipe, which has different pore size to provide relatively larger capillary force, and provide relatively lower flow resistance and heat resistance at the same time. The heat transfer capability of the heat pipe is thus increased. The artery meshes 12 are distributed along the longitudinal direction of the heat pipe and linearly contact with the heat pipe. As a result, the artery mesh 12 can not easily be damaged by the flattening process of the heat pipe.

Figure 6:
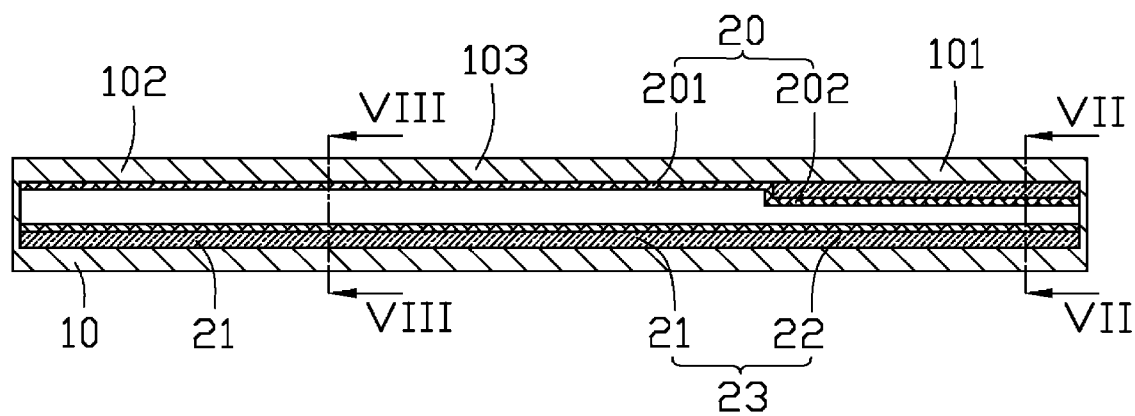
FIG. 6 is similar to FIG. 1, but shows the heat pipe according to a second embodiment of present invention.
Figure 7:
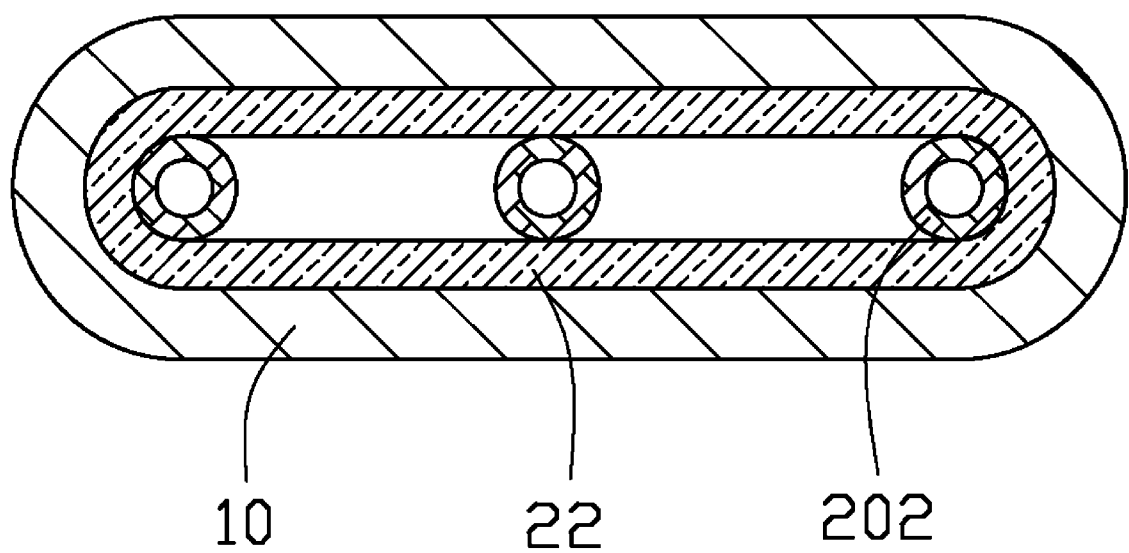
FIG. 7 is a transverse cross-sectional view of the evaporating section of the heat pipe of FIG. 6 taken along line VII-VII.
Figure 8:
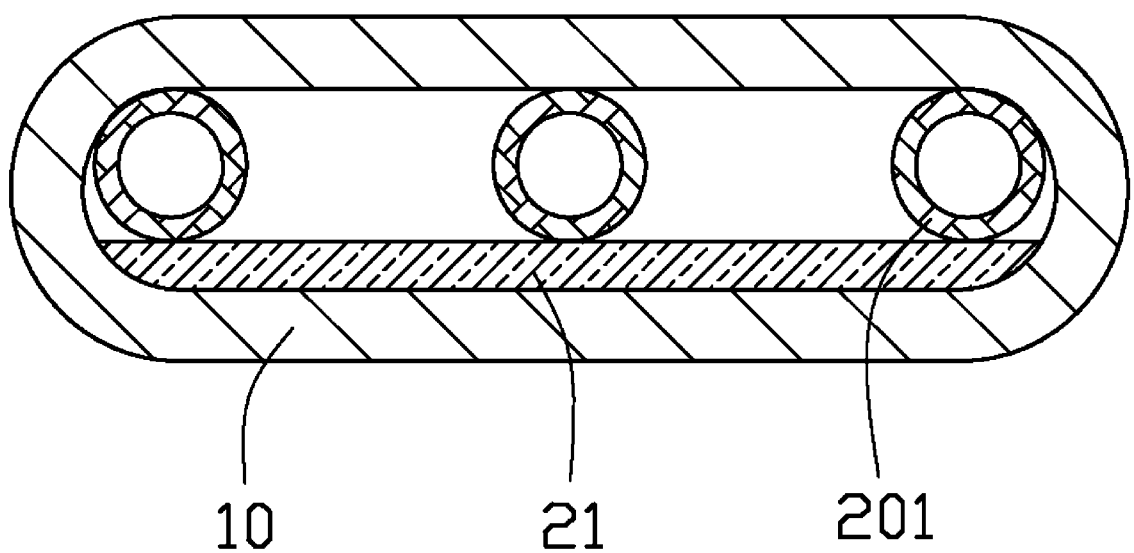
FIG. 8 is a transverse cross-sectional view of the condensing section of the heat pipe of FIG. 6 taken along line VIII-VIII.

FIGS. 6-8 schematically show the heat pipe in accordance with an alternative embodiment of the present invention. The casing 10 of the heat pipe of this embodiment is the sane as the first embodiment. In this embodiment, the wick 23 includes a elliptic-shaped first portion 22 arranged at the evaporating section 101 of the metal casing 10 of the heat pipe, and a planar-shaped second portion 21 arranged at the bottom side of the condensing section 102 and the adiabatic section 103 of the metal casing 10. The artery meshes 20 are disposed in the casing 10 in parallel. Each artery mesh 20 includes a small portion 202 located within and contacting with the first portion 22 of the wick 23, and a large portion 201 extending from the small portion 202 to the condensing section 102 of the heat pipe. The large portion 201 and the small portion 202 are each cylindrical shaped. An axis of the small portion 202 is offset from that of the large portion 201. The small portion 202 of the artery mesh 20 linearly contact with the top and bottom sides of the first portion 22 of the wick 23. A top of the large portion 201 of the artery mesh 20 linearly contacts with the inner wall of the condensing and adiabatic sections 102, 103 of the heat pipe, whilst a bottom of the large portion 201 of the artery mesh 20 linearly contacts with the second portion 21 of the wick 23.

As the wick 23 extends to the condensing section 102 of the heat pipe, not only the evaporating section 101 of the heat pipe forms a composite wick structure with different pore sizes, but also a composite wick structure is formed at the condensing section 102 of the heat pipe. The pore size of the first portion 22 of the wick 23 can be larger than that of the second portion 21 of the wick 23. According to the general rule, the capillary pressure of the wick structure and its flow resistance to the condensed fluid increase due to a decrease in pore size of the wick structure; the first portion 22 of the wick 23 corresponding to the evaporating section 101 of the heat pipe is thus capable of providing a capillary pressure gradually increasing from the condensing section 102 toward the evaporating section 101, and a flow resistance gradually decreasing from the evaporating section 101 toward the condensing section 102. It is to be understood that the wick 23 arranged at the evaporating section 101 and the condensing section 102 can be different from each other, such as, the first portion 22 of the wick 23 is sintered powder wick, whilst the second portion 21 of the wick 23 is groove wick. Although, as shown in these embodiments, there are three artery meshes 12, 20 disposed in the casing 10 and evenly spaced from each other, it is to be understood that the artery meshes 12, 20 can be tidily attached to each other thus to increase the number of the artery meshes 12, 20 of the heat pipe, and further the number of the artery meshes 12, 20 can be changed according to the size of the heat pipe. A configuration of the artery mesh 12, 20 can also be changed. For example, the artery mesh 12, 20 can have a shape similar to that of the casing 10 of the heat pipe, thus the artery mesh 12, 20 can have a surface contact with the casing 10 or the wick 13, 23.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat pipe comprising:
an elongated casing having an evaporating section and a condensing section;
a wick disposed on an inner wall of the evaporating section of the casing;
at least one artery mesh disposed in the casing, the at least one artery mesh having a large portion and a small portion with an outer diameter smaller than that of the large portion, the small portion located within the evaporating section of the casing and being in direct physical contact with an inner surface of the wick, the large portion being in direct physical contact with an inner wall of the condensing section of the casing; and
working medium filled in the casing and saturating the wick and the at least one artery mesh;
wherein a bottom of the wick extends to the condensing section of the heat pipe, an axis of the large portion of the at least one artery mesh being offset from that of the small portion, a top of the large portion being in direct physical contact with the inner wall of the condensing section, and a bottom of the large portion being in direct physical contact with the wick.

2. The heat pipe of claim 1, wherein the heat pipe is a flat-type heat pipe, a substantially linear section of the large portion of the at least one artery mesh is in direct physical contact with the inner wall of the condensing section, and a substantially linear section of the small portion of the at least one artery mesh is in direct physical contact with the wick.

3. The heat pipe of claim 2, wherein the at least one artery mesh comprises a plurality of artery meshes disposed in the casing of the heat pipe and contacting each other.

4. The heat pipe of claim 2, wherein the at least one artery mesh comprises a plurality of artery meshes disposed in the casing of the heat pipe and spaced from each other.

5. The heat pipe of claim 2, wherein a thickness of the heat pipe is not larger than 2 mm, and a thickness of the wick is not larger than 0.1 mm.

6. The heat pipe of claim 1, wherein the at least one artery mesh is a hollow tube with an inner diameter ranging from 0.5 mm to 2 mm, the at least one artery mesh being made of a plurality of woven metal wires selected from a group consisting of copper wires and stainless steel wires.

7. A heat pipe comprising:
a flat tube-like metal casing having an evaporating section and a condensing section, a width of the casing being larger than a height of the casing;
a wick disposed on an inner wall of the evaporating section of the casing;
a plurality of artery meshes disposed in the casing, each artery mesh having a large portion being in direct physical contact with an inner wall of the condensing section of the casing and a small portion located within and being in direct physical contact with the wick; and
working medium filled in the casing and saturating the wick and the artery meshes;
wherein a bottom of the wick extends to the condensing section of the heat pipe, an axis of the large portion of each of the artery meshes being offset from that of the small portion, a top of the large portion being in direct physical contact with the inner wall of the condensing section, and a bottom of the large portion being in direct physical contact with the wick.

8. The heat pipe of claim 7, wherein a thickness of the heat pipe is not larger than 2 mm, and a thickness of the wick is not larger than 0.1 mm.

9. The heat pipe of claim 7, wherein the artery mesh is a hollow tube with an inner diameter ranging from 0.5 mm to 2 mm just for the condensed working medium flowing therethrough.

10. The heat pipe of claim 7, wherein the artery meshes are one of woven copper wires and woven stainless steel wires.

11. A heat pipe comprising:
a metal casing including an evaporating section and a condensing section;
a wick structure arranged at the evaporating section, the wick structure disposed around an inner wall of the evaporating section;
at least a hollow, interwoven artery mesh including a first mesh portion arranged at the evaporating section and a second mesh portion arranged at the condensing section, the first mesh portion located within and being in direct physical contact with the wick structure, the first mesh portion having a diameter smaller than that of the second mesh portion, the second mesh portion being in direct physical contact with an inner wall of the condensing section;
another wick structure arranged at a bottom portion of the condensing section and connected with the wick structure in the evaporating section, a bottom portion of the at least an artery mesh being disposed on and in direct physical contact with said another wick structure; and
working medium received in the casing.

12. The heat pipe of claim 11, wherein the at least an artery mesh is a plurality of artery meshes, and the artery meshes are evenly spaced from each other in the metal casing.

* * * * *